(12) United States Patent
Cha

(10) Patent No.: US 7,310,275 B2
(45) Date of Patent: Dec. 18, 2007

(54) NON-VOLATILE MEMORY DEVICE AND METHOD FOR OPERATION PAGE BUFFER THEREOF

(75) Inventor: Jae Won Cha, Kyeongki-do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 119 days.

(21) Appl. No.: 11/297,052

(22) Filed: Dec. 7, 2005

(65) Prior Publication Data

US 2006/0181924 A1 Aug. 17, 2006

(30) Foreign Application Priority Data

Feb. 17, 2005 (KR) ............. 10-2005-0013021

(51) Int. Cl.
*G11C 7/10* (2006.01)
(52) U.S. Cl. .................. 365/189.05; 365/230.08; 365/189.08
(58) Field of Classification Search ............ 365/189.05, 365/189.08, 230.08
See application file for complete search history.

(56) References Cited

U.S. PATENT DOCUMENTS

| | | | | |
|---|---|---|---|---|
| 6,717,857 B2* | 4/2004 | Byeon et al. | ........ | 365/185.21 |
| 6,738,288 B2* | 5/2004 | Kawamura et al. | .... | 365/185.11 |
| 6,813,184 B2* | 11/2004 | Lee | ........ | 365/185.09 |
| 6,826,082 B2* | 11/2004 | Hwang et al. | ........ | 365/185.17 |
| 6,996,014 B2* | 2/2006 | Lee et al. | ........ | 365/189.05 |
| 2006/0007774 A1* | 1/2006 | Zanardi et al. | ........ | 365/235 |
| 2006/0187710 A1* | 8/2006 | Son | ........ | 365/185.09 |
| 2006/0198188 A1* | 9/2006 | Ju | ........ | 365/185.12 |

FOREIGN PATENT DOCUMENTS

| | | |
|---|---|---|
| JP | 2003-059277 A | 2/2003 |
| JP | 02003233995 A * | 8/2003 |
| KR | 100255957 B1 | 2/2000 |
| KR | 2003-0033679 | 5/2003 |
| KR | 2003-0088595 | 11/2003 |
| KR | 010344021 A1 * | 7/2004 |

* cited by examiner

*Primary Examiner*—Viet Q. Nguyen
(74) *Attorney, Agent, or Firm*—Townsend and Townsend and Crew LLP

(57) ABSTRACT

A non-volatile memory device includes a memory cell array including memory cells, each memory cell being defined at an intersection of a word line and a bit line. A page buffer is coupled to the memory cell array via a sensing line. The page buffer comprises a first latch unit including a first latch circuit and coupled to the sensing line, the first latch unit being configured to be activated during a copy-back program operation to read data stored in a first memory cell and reprogram the data to a second memory cell that is different from the first memory cell. The page buffer also includes a second latch unit including a second latch circuit and coupled to the sensing line, the second latch unit being configured not to be activated during the copy-back operation and be activated during program, read, and verification operations, the second latch unit configured to receive data to be programmed in the memory cells and store the data during the program operation, the second latch unit configured to read the data programmed in the memory cells and store the read data during the read and verification operations.

21 Claims, 7 Drawing Sheets

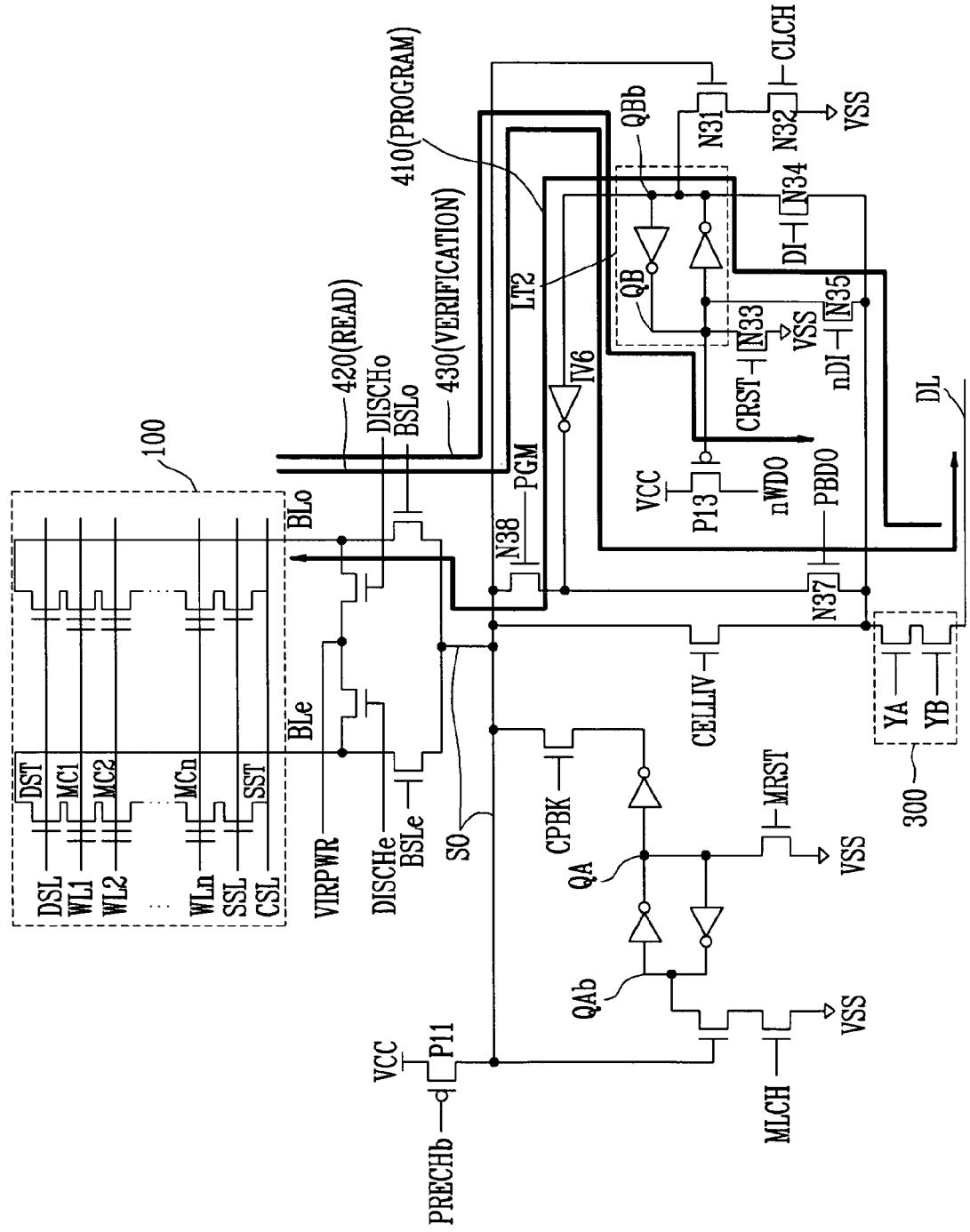

NON-VOLATILE MEMORY DEVICE AND METHOD FOR OPERATION PAGE BUFFER THEREOF

BACKGROUND OF THE INVENTION

The present invention relates to non-volatile memory devices and methods for operating them. More particularly it relates to a NAND-type flash memory device capable of shortening a copy-back program time by changing an operation of a page buffer, and a method for operating the page buffer.

Recently, there has been increasing demand for semiconductor memory devices which do not require periodic refresh operations and are electrically programmable and erasable. A program operation writes data to the memory cells.

To achieve high integration of semiconductor memory devices, NAND-type flash memory devices have a plurality of memory cells that share a common connection. In other words, neighboring cells share a drain and source with each other. Unlike NOR-type flash memory cells, NAND-type flash memory cells are capable of reading out information sequentially.

NAND-type flash memory devices employ a page buffer in order to store large quantities of information or read out stored data within a short time. The page buffer receives a large amount of data from I/O (Input/Output) PAD to provide the data to a memory cell or store the data in the memory cell to output it. In general, page buffers are comprised of a single register so as to temporarily store data. Recently, NAND-type flash memory devices with a dual register have been introduced for the purpose of improving programming speed when programming a large amount of data.

Copy-back program operation refers to transmitting data stored in a defective cell to a normal cell utilizing page buffers.

FIG. 1 is a block diagram illustrating a copy-back program operation of a conventional NAND-type flash memory device.

With reference to FIG. 1, a conventional copy-back program operation is carried out as follows. Data stored in a defective cell is read out to a first latch unit 24 of a page buffer 20. The data read out from the first latch unit 24 is transmitted to a second latch unit 25. The transmitted data in the second latch unit 25 is programmed to another memory cell that presumably functions properly (or "normal cell").

FIG. 2 is a block diagram illustrating program, read, and verification operations of a conventional NAND-type flash memory device.

With reference to FIG. 2, if the first latch unit 24 is selected from the first and second latch units 24 and 25, the second latch unit 25 is inactivated, and program operation 51 and read and verification operation 52 are carried out in the first latch unit 24. In contrast, if the second latch unit 25 is selected, the first latch unit 24 is inactivated, and program operation 61 and read and verification operation 62 are carried out in the second latch unit 25.

In the above-mentioned copy-back program operation, there is a high probability that errors occur in transmitting data between the first latch unit 24 and the second latch unit 25. Accordingly, a timing margin may not be sufficiently secured during a copy-back program operation.

BRIEF SUMMARY OF THE INVENTION

According to embodiments of the present invention, there is provided a non-volatile memory device capable of eliminating errors and reducing copy-back program operation time by changing operations of latch units at page buffers in transmitting data between latch units during a copy-back program operation and a method for operating the page buffers thereof.

In further embodiments of the present invention, a non-volatile memory device comprises an array including memory cells disposed at intersections of word lines and bit lines and a plurality of page buffers connected to the array by a sensing line. Each of the page buffers comprises a first latch unit and a second latch unit. The first latch unit becomes activated during a copy-back program operation and reads data programmed to a defective memory cell to store the data in a normal cell. The second latch unit is inactivated during the copy-back operation and activated during program, read, and verification operations. In addition, the second latch unit is configured to receive data to be programmed in the memory cells and store the data during the program operation. Furthermore, the second latch unit is configured to read the data programmed in the memory cells and store the read out data during the read and verification operations.

In another embodiment of the present invention, a method for operating a page buffer of a non-volatile memory device comprises an array including memory cells disposed at intersections of word lines and bit lines and a plurality of page buffers connected to the array by a sensing line and having first and second latch units. The method according to the present invention comprises activating the first latch unit of the page buffer and inactivating the second latch unit of the page buffer during a copy-back program operation and activating the second latch unit and inactivating the first latch unit during program, read, and verification operations.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings:

FIG. 7 is a circuit diagram illustrating program, read, and verification operations of the NAND-type flash memory device shown in FIG. 5.

DETAILED DESCRIPTION OF THE INVENTION

The present invention will be described below in more detail using specific embodiments and the accompanying drawings. The present invention may, however, be embodied in different forms and should not be construed as being limited to the embodiments set forth herein. Rather, these embodiments are provided for illustrative purposes to those skilled in the art. Like numerals refer to like elements.

Hereinafter, the invention will be described with reference to an exemplary embodiment of the present invention in conjunction with the accompanying drawings.

Figure 1:
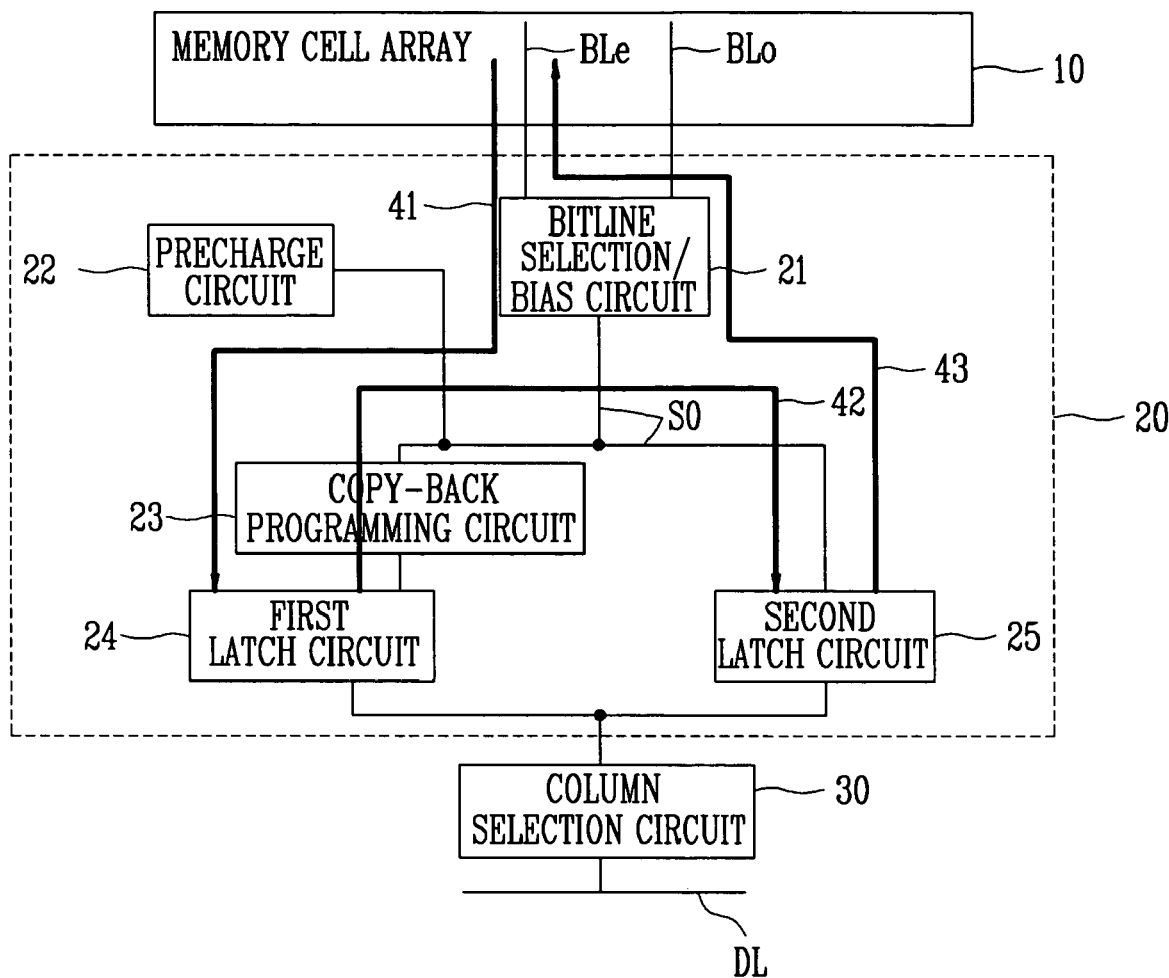
FIG. 1 is a block diagram illustrating a copy-back program operation of a conventional NAND-type flash memory device.
Figure 2:
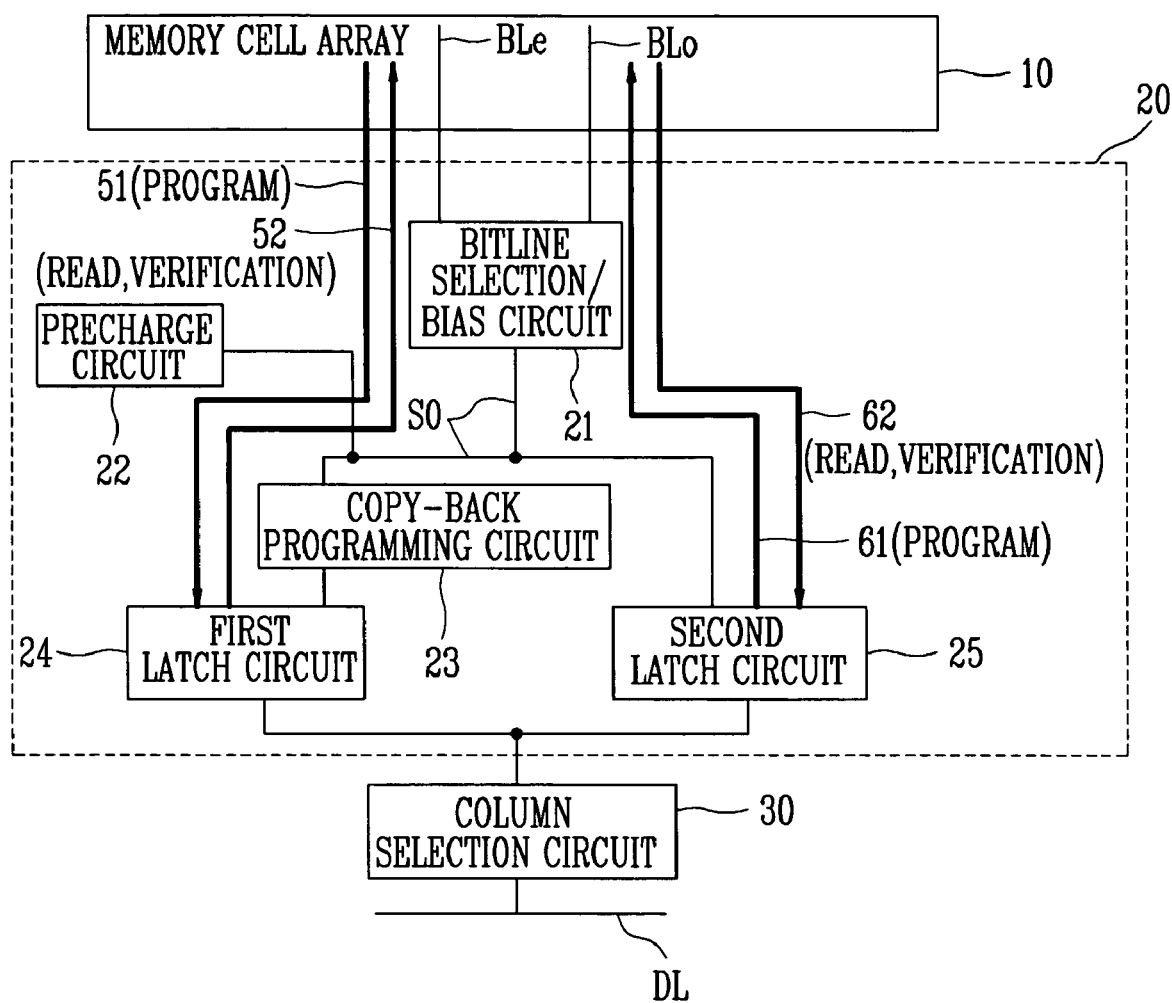
FIG. 2 is a block diagram illustrating program, read, and verification operations of a conventional NAND-type flash memory device.
Figure 3:
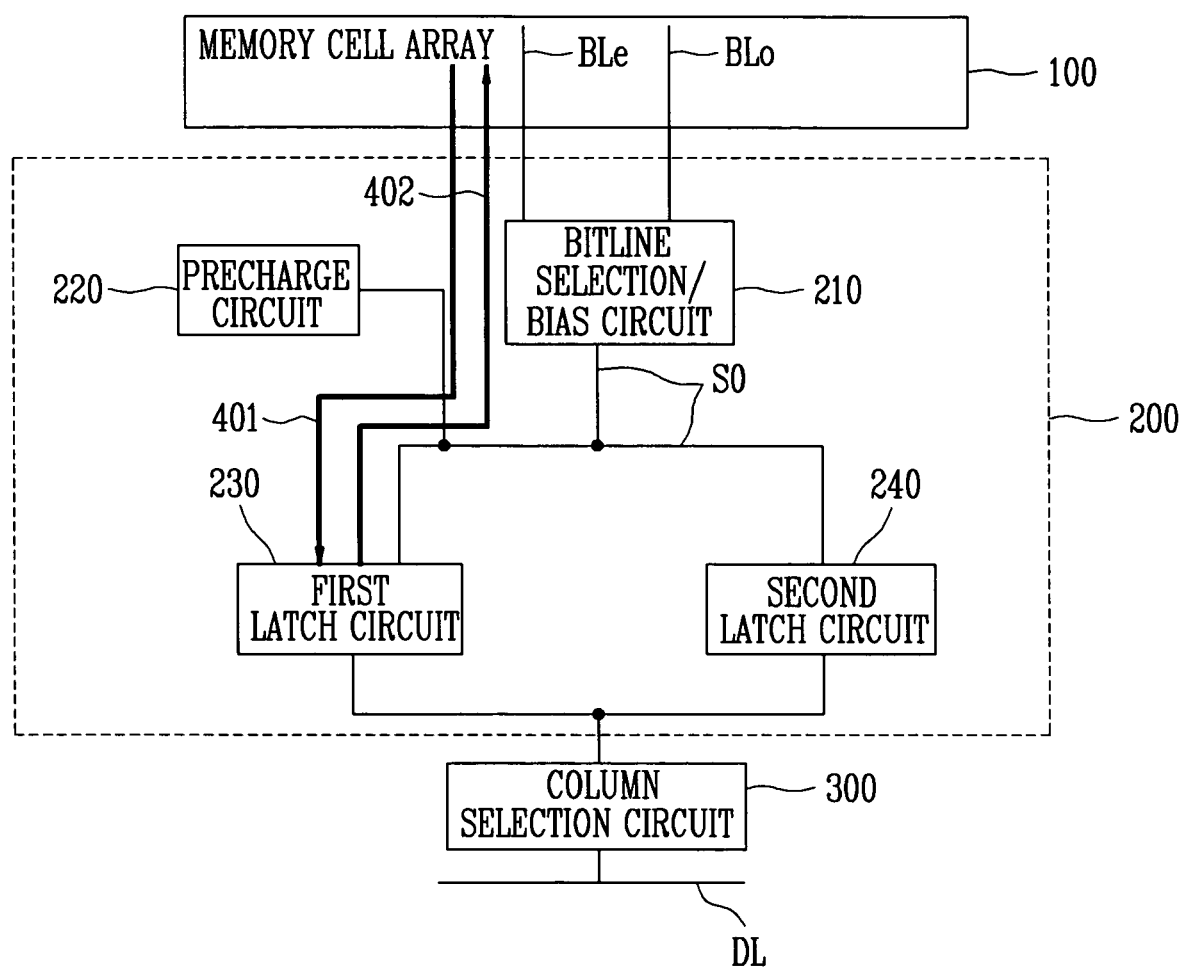
FIG. 3 is a block diagram illustrating a copy-back program operation of a NAND-type flash memory device according to one embodiment of the present invention.

FIG. 3 is a block diagram illustrating a copy-back program operation of a NAND-type flash memory device according to a preferred embodiment of the present invention.

With reference to FIG. 3, a copy-back program operation is performed as follows. Data is read out from a defective cell by charging a sensing line S0 utilizing a precharging unit 220 to store the read out data in a first latch unit 230 (step S401). Then, the read out data stored in the first latch unit 230 is reprogrammed to a normal cell (step S402).

As stated above, the NAND-type flash memory device performs a copy-back program operation utilizing the first latch 230 and not the second latch 240.

Figure 4:
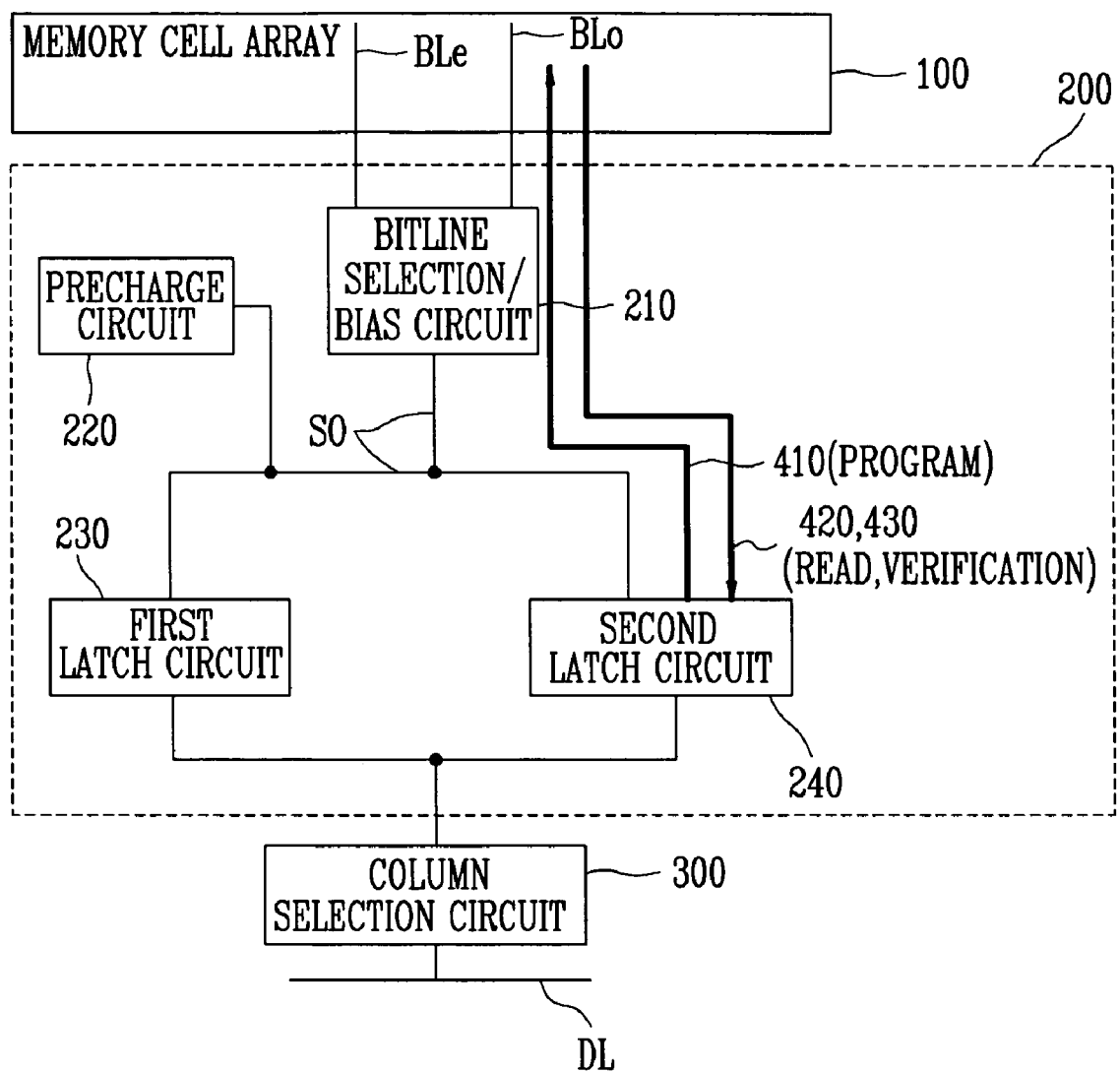
FIG. 4 is a block diagram illustrating program, read, and verification operations of a NAND-type flash memory device according to one embodiment of the present invention.

FIG. 4 is a block diagram illustrating program, read, and verification operations of a NAND-type flash memory device according to a preferred embodiment of the present invention.

With reference to FIG. 4, program 410, read 420, and verification 430 operations are performed by the second latch unit 240. The first latch unit 230 is in an inactivated state during the program, read, and verification operations.

Figure 5:
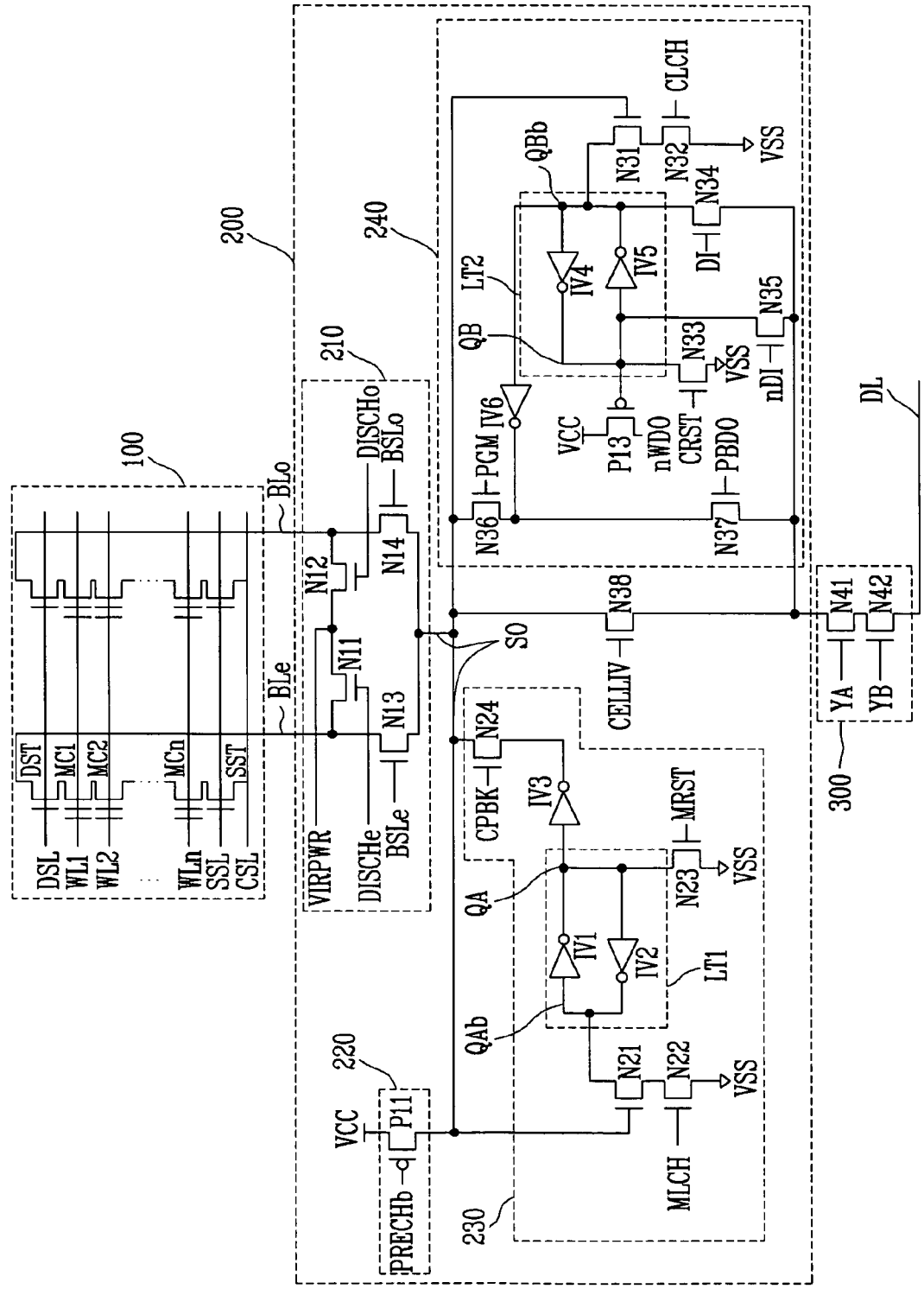
FIG. 5 is a circuit diagram the NAND-type flash memory device shown in FIGS. 3 and 4.

FIG. 5 is a detailed circuit diagram showing the NAND-type flash memory device of FIGS. 3 and 4.

With reference to FIG. 5, the NAND-type flash memory device includes a memory cell array 100, a page buffer 200, and a column selection unit 300.

In the memory cell array 100, BLe indicates even numbered bit lines, and BLo indicates odd numbered bit lines. A multiplicity of memory cells MC1 through MCn are connected to the bit line BLe, and the remainder of memory cells are connected to the bit line BLo. The memory cells connected to one word line (e.g., WL1) forms one page.

The page buffer 200 is connected between the memory cell array 100 and the column selection unit 300. Although only one page buffer is shown in FIG. 5, a plurality of page buffers 200 may be present in the flash memory device. The page buffer 200 is connected through the sensing line S0 to the bit lines BLe and BLo and includes a bit line selection unit 210, the precharging unit 220, the first latch unit 230, and the second latch unit 240.

The bit line selection unit 210 includes transistors N11 through N14. One end of the transistor N11 is connected to the bit line BLe, and the other end of that is connected to a line providing a power supply signal VIRPWR. The transistor N11 is turned on/off by applying a gate control signal DISCHe to a gate. This transistor N11 is turned on by the gate control signal DISCHe so as to apply a power voltage VCC as the power supply signal VIPWR to the bit line BLe and program the corresponding memory cells. One end of the transistor N12 is connected to the bit line BLo, and the other end of is connected to a line providing a power supply signal VIRPWR. The transistor N12 is turned on/off by applying the gate control signal DISCHo to a gate. This transistor N12 is turned on by the gate control signal DISCHo so as to apply the power voltage VCC as the power supply signal VIRPWR to the bit line and program the corresponding memory cells. The NMOS transistor N13 connects the bit line BLe to the sensing line S0 in response to a bit line selection signal BSLe. The NMOS transistor N14 connects the bit line BLo to the sensing line S0 in response to a bit line selection signal BLe.

The precharging unit 220 is connected between the power voltage VCC and the sensing line S0 and includes a PMOS transistor P11 turned on/off by receiving a precharge signal PRECHb. The PMOS transistor P11 precharges the sensing line S0 to the power voltage VCC in reading out data stored in the memory cell.

The first latch unit 230 is activated only during copy-back program operation and includes NMOS transistors N21 through N24, a first latch circuit LT1, and an inverter IV3. The first latch circuit LT1 comprises inverters IV1 and IV2 and stores data read from the memory cells. The NMOS transistor N23 is connected between a node QA of the first latch circuit LT1 and a ground voltage VSS. In addition, the NMOS transistor N23 initializes the node QA to "0" and the node QAb to "1" when a reset signal MRST is applied to its gate. The NMOS transistor N21 is turned on/off in response to a signal of the sensing line S0, and the NMOS transistor N22 is turned on/off in response to a latch signal MLCH. Turning on the NMOS transistor N21 and the NMOS transistor N22 at the same time, changes the node QAb to "0" and the node QA to "1". The inverter IV3 inverts data of the node QA and then outputs the data. The NMOS transistor N24 is turned on by a copy-back signal CPBK during a copy-back program operation to transmit data outputted by the inverter IV3 to a selected bit line (e.g., BLe) through the sensing line S0.

The second latch unit 240 is activated during program, read, and verification operations. The second latch unit 240 includes NMOS transistors N31 through N37, a second latch circuit LT2, and an inverter IV6. The second latch circuit LT2 includes inverters IV3 and IV4 and stores data that is read out from the memory cells. The NMOS transistor N33 is provided between a node QA of the second latch circuit LT2 and a ground voltage VSS. In addition, the NMOS transistor N33 initializes the node QB to "0" and the node QBb to "1" when a reset signal CRST is applied to its gate. The NMOS transistor N31 is turned on/off in response to a signal of the sensing line S0, and the NMOS transistor N32 is turned on/off in response to a latch signal CLCH. Turning both NMOS transistor N31 and NMOS transistor N32 on at the same time changes the node QBb to "0" and the node QB to "1". The inverter IV6 inverts data of the node QBb and then outputs the data. The NMOS transistor N34 transfers the data that is received from a data line DL to the second latch circuit LT2 in response to a data input signal DL. The NMOS transistor N35 transfers the data that received from the data line DL to the second latch circuit LT2 in response to a data input signal nDI. The NMOS transistor N36 is turned on by a program signal PGM during a program operation, thereby transferring data outputted from the inverter IV6 to the sensing line S0 in order to program the data to the memory cells, i.e., the memory cells that are associated with the selected bit line BLe or BLo. The NMOS transistor N37 is turned on by a read-out signal PBD0 during a read operation, thereby transferring data outputted to the selected bit line BLe or BLo, that is, data outputted from the inverter IV6 to the data line DL by the column selection unit 300. A PMOS transistor P13 is connected between the power voltage VCC and a node nWD0 and is turned on/off by applying data of the node QB of the second latch circuit LT2 to the gate. The PMOS transistor P13 verifies pass/fail of a program according to whether the node nWD0 is in a floating state or logically high.

The NMOS transistor N38 is turned on by a signal CELLIV during a test operation and employed to measure voltage and current of the page buffer.

The column selection unit 300 connected between the page buffer 200 and the data line DL includes two NMOS transistors N41 and N42, which are controlled by column selection signals YA and YB. The column signal YA and YB are generated by a column addressing unit (not shown).

Figure 6:
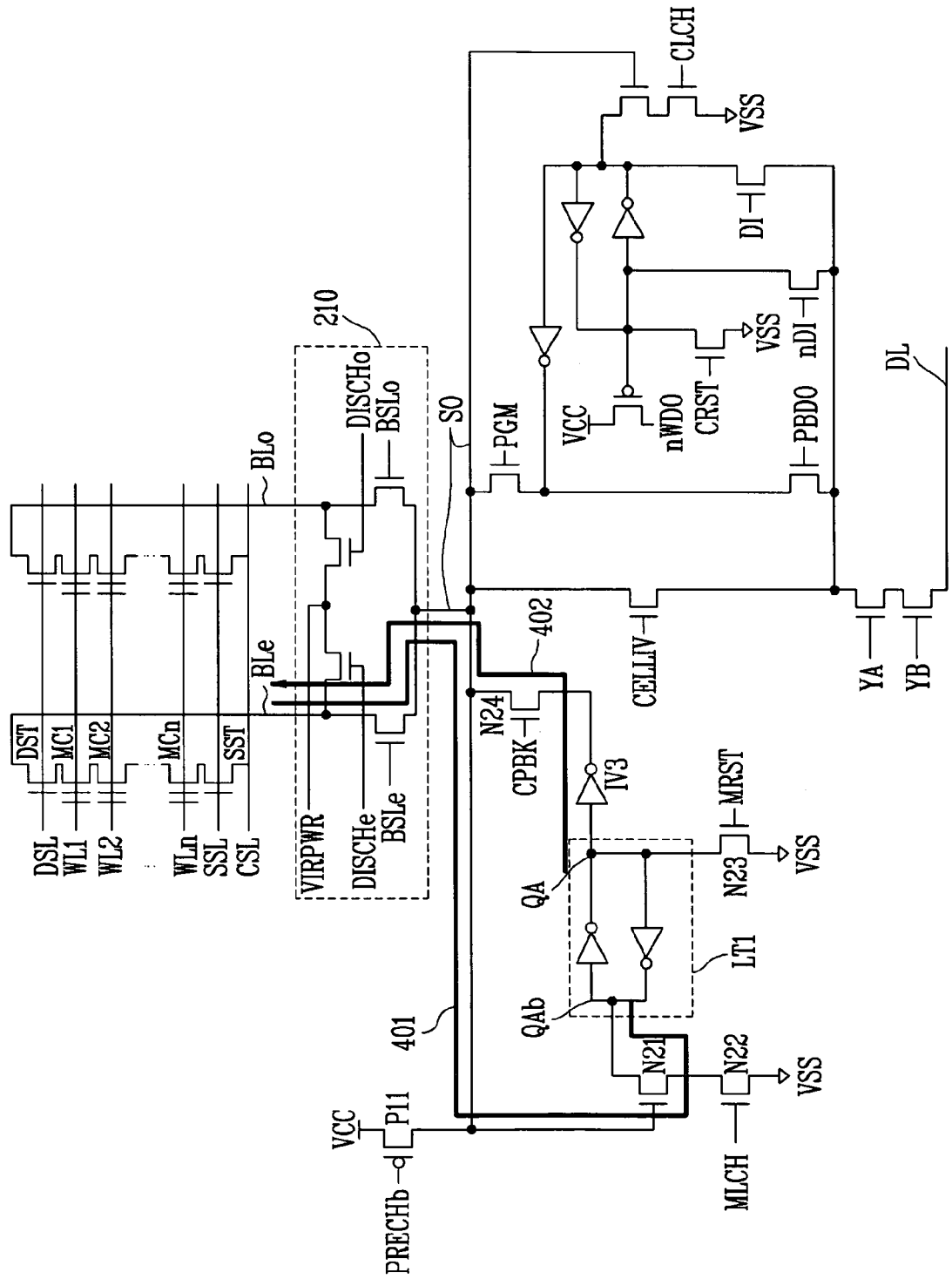
FIG. 6 is a circuit diagram illustrating the copy-back program operation of the NAND-type flash memory device shown in FIG. 5.

FIG. 6 is a circuit diagram illustrating a copy-back program operation of the NAND-type flash memory device according to a preferred embodiment of the present invention.

A copy-back program operation proceeds in accordance with the following steps. A word line WL1 is enabled, and stored data in the memory cell MC1 is read out by selecting the bit line BLe in order to reprogram the stored data to the memory cell MC2.

Nodes QA and QAb of the first latch circuit LT1 are initialized to "0" and "1", respectively. Then, the PMOS transistor P11 is turned on, thereby precharging the sensing line S0 to a level of the power voltage VCC. Since the memory cell MC1 is a programmed cell, the sensing line S0 is maintained in a precharged state.

The NMOS transistors N21 and N22 are turned on so that the nodes QA and QAb of the first latch circuit LT1 are inverted to "1" and "0", respectively (Read operation 401). Data "1" of the node QA of the first latch circuit LT1 is inverted to "0" by the inverter IV3 to be outputted. In this case, the NMOS transistor N24 is turned on by the copy-back signal CBPK, so that data "0" outputted from the inverter IV3 is transmitted to the selected bit line BLe by the sensing line S0. As a result, the memory cell MC2 is reprogrammed (Program operation 402).

As mentioned above, the copy-back program operations 401 and 402 are carried out by the first latch unit 230.

FIG. 7 is a circuit diagram illustrating program, read, and verification operations of the NAND-type flash memory device according of one embodiment of the present invention.

For example, a method for programming data in a memory cell selected by the word line WL1 and the bit line BLo (Program operation 410) will be explained herein.

During a program operation, if data "0" transmitted from the data line DL is inputted to the NMOS transistor N35 by the column selection unit 300, the NMOS transistor N35 is turned on by the data input signal nDI, thereby storing the data "0" in the second latch circuit LT2. As a result, the nodes QB and QBb of the second latch circuit LT2 become "0" and "1", respectively. At this time, the inverter IV6 inverts data "1" of the node QBb of the second latch node LT2 to "0". The NMOS transistor N38 is turned on by the program signal PGM to program data in the memory cell by applying the data "0" to the selected bit line (e.g., BLo) by the sensing line S0.

Next, a method for reading data stored in a memory cell selected by the word line WL1 and the bit line BLo (Read operation 420) will be explained.

During a read operation, the PMOS transistor P11 is turned on to precharge the sensing line S0 to power voltage VCC. In this case, if the sensing line S0 is maintained in a precharged state, the NMOS transistors N31 and N32 are turned on. As a result, the nodes QBb and QB of the second latch circuit LT2 become "0" and "1". At this time, the inverter IV6 inverts data "0" of the node QBb of the second latch circuit LT2 to output data "1". Contemporaneously, the NMOS transistor N37 is turned on by the read out signal PBD0, thereby transmitting the data "1" to the data line DL through the column selection unit 300.

Next, a method for verifying whether data is normally programmed in a memory cell selected by the word line WL1 and the bit line BLo (Verification operation 430) will be explained.

The PMOS transistor P11 is turned on to precharge the sensing line S0 to power voltage VCC. In this case, if the sensing line S0 is maintained in a precharged state, the NMOS transistors N31 an N32 are turned on, so that the nodes QBb and QB of the first latch circuit LT2 become "0" and "1", respectively. If so, the PMOS transistor P13 is turned off by data "1" of the node QB of the second latch circuit LT2. Consequently the node nWD0 is placed in a floating state and the program result is evaluated as "pass". By contrast, if the sensing line S0 is discharged, the NMOS transistors N31 and N32 become turned off, so that the nodes QBb and QB of the second latch circuit LT2 are initially maintained to "1" and "0". Thus, the PMOS transistor P13 is turned on by data "0" of the node QB of the second latch circuit LT2. Consequently the node nWD0 is raised to the power voltage VCC, and the program result is evaluated as "fail".

As previously mentioned, data is read out from a defective memory cell to be stored in a first latch unit. Then, the stored data of the first latch unit is not transmitted to a second latch unit but directly transmitted to a selected bit line. The transmitted data can then be reprogrammed in a memory cell. Therefore, the copy-back program operation speed is advantageously improved over a convention method where the second latch unit is used to reprogram the data.

The present invention has been described in connection with the specific embodiments of the present invention and the accompanying drawings. It will be apparent to those skilled in the art that various substitution, modifications and changes may be made thereto without departing from the scope and spirit of the invention.

What is claimed is:

1. A non-volatile memory device comprising:
   a memory cell array including memory cells, each memory cell being defined at an intersection of a word line and a bit line; and
   a page buffer coupled to the memory cell array via a sensing line, wherein the page buffer comprises:
     a first latch unit including a first latch circuit and coupled to the sensing line, the first latch unit being configured not to be activated during program, read, and verification operations and to be activated during a copy-back program operation to read data stored in a first memory cell and reprogram the data to a second memory cell that is different from the first memory cell; and
     a second latch unit including a second latch circuit and coupled to the sensing line, the second latch unit being configured not to be activated during the copy-back operation and be activated during program, read, and verification operations, the second latch unit configured to receive data to be programmed in the memory cells and store the data during the program operation, the second latch unit configured to read the data programmed in the memory cells and store the read data during the read and verification operations.

2. The non-volatile memory device as set forth in claim 1, wherein the first latch unit reads the data stored in the first memory cell via a bit line selected from a plurality of bit lines during the copy-back operation, and reprograms the read data in the second memory cell by inversing the stored data and transmitting the inversed data to the selected bit line.

3. The non-volatile memory device as set forth in claim 1, wherein the first latch circuit of the first latch unit is configured to read the data stored in the first memory cell during the copy-back operation;

wherein the first latch unit further includes:

a first discharging unit configured to discharge a first node of the first latch circuit if the sensing line is in a precharge state;

a first inversion unit configured to inverse data of a second node of the first latch circuit; and a first transmission unit configured to transmit data outputted from the inversion unit to the second memory cell.

4. The non-volatile memory device as set forth in claim 1, wherein the second latch circuit of the second latch unit is configured to store data read from a given memory cell during read and verification operations or program data received via a data line into a given memory cell during a program operation;

wherein the second latch unit further includes:

a second discharging unit configured to discharge a third node of the second latch circuit if the sensing line is in a precharge state during a read operation;

a second inversion unit configured to inverse data of the second node of the second latch circuit during a program or read operation;

a first switch configured to read the data received by the second inversion unit from a data line during a program operation;

a second switch configured to transmit the inversed data of the second inversion unit during a program operation to a bit line selected from the bit lines; and a verification unit configured to read the data of the second node of the second latch circuit to verify to determine whether or not a program is passed or failed during a read operation.

5. The non-volatile memory device as set forth in claim 1, wherein the page buffer further includes:

a precharging unit configured to precharge the sensing line in reading the data programmed in the memory cells; and a bitline selection and bias unit configured to select one of the bitlines and couple the selected bitline to the sensing line.

6. A method a non-volatile memory device comprising an array of memory cells disposed at intersections of word lines and bit lines, the device having a page buffer coupled to a sensing line, the page buffer having first and second latch units, the method comprising:

activating the first latch unit of the page buffer during a copy-back program operation, the second latch unit of the page buffer being not be activated during the copy-back program operation; and activating the second latch unit during program, read, and verification operations, the first latch unit being not activated during the program, read, and verification operations.

7. The method as set forth in claim 6, wherein the copy-back program operation comprises:

reading data stored in a first memory cell from the memory cell array by selecting a bitline associated with the first memory cell, the first memory cell being a defective cell;

inversing the read data in the first latch unit; and transmitting the inversed data to the selected bit line via the sensing line and reprogramming the transmitted data to a second memory cell that is different from the first memory cell.

8. The method as set forth in claim 7, wherein the reading step comprises:

precharging the sensing line;

thereafter, determining whether or not the sensing line is in a precharge state or discharge state.

9. The method as set forth in claim 7, wherein the inversing the read data comprises inversing data of a first node of the first latch unit.

10. The method as set forth in claim 6, wherein the program operation comprises:

storing data received from a external source via the data line in the second latch unit;

inversing the data stored in the second latch unit; and transmitting the inversed data to a selected bit line selected to program the transmitted data in a memory cell associated with the selected bit line.

11. The method as set forth in claim 6, wherein the read operation comprises:

precharging the sensing line;

determining whether or not the sensing line is in a precharge state or discharge state to read the data programmed in a memory cell and then store the read data in the second latch unit;

inversing the read data stored in the second latch unit; and outputting the inversed data to the data line.

12. The method as set forth in claim 6, wherein the verification operation comprises:

precharging the sensing line;

determining whether or not the sensing line is in a precharge state or discharge state; and determining whether or not a program operation has failed using a voltage level of the data stored in the second latch unit.

13. A non-volatile memory device comprising:

a memory cell array including memory cells, each memory cell being defined at an intersection of a word line and a bit line; and a page buffer coupled to the memory cell array via a sensing line, wherein the page buffer comprises:

a first latch unit including a first latch circuit and coupled to the sensing line, the first latch unit being configured to be activated during a copy-back program operation to read data stored in a first memory cell and reprogram the data to a second memory cell that is different from the first memory cell by inversing the stored data and transmitting an inversed data to the selected bit line, and a second latch unit including a second latch circuit and coupled to the sensing line, the second latch unit being configured not to be activated during the copy-back operation and be activated during program, read, and verification operations, the second latch unit configured to receive data to be programmed in the memory cells and store the data during the program operation, the second latch unit configured to read the data programmed in the memory cells and store the read data during the read and verification operations.

14. The non-volatile memory device as set forth in claim 13, wherein the first latch circuit of the first latch unit is configured to read the data stored in the first memory cell during the copy-back operation, the first latch unit further including:
   a first discharging unit configured to discharge a first node of the first latch circuit if the sensing line is in a precharge state;
   a first inversion unit configured to inverse data of a second node of the first latch circuit; and
   a first transmission unit configured to transmit data outputted from the inversion unit to the second memory cell.

15. The non-volatile memory device as set forth in claim 13 wherein the second latch circuit of the second latch unit is configured to store data read from a given memory cell during read and verification operations or program data received via a data line into a given memory cell during a program operation, the second latch unit further including:
   a second discharging unit configured to discharge a third node of the second latch circuit if the sensing line is in a precharge state during a read operation;
   a second inversion unit configured to inverse data of the second node of the second latch circuit during a program or read operation;
   a first switch configured to read the data received by the second inversion unit from a data line during a program operation;
   a second switch configured to transmit the inversed data of the second inversion unit during a program operation to a bit line selected from the bit lines; and
   a verification unit configured to read the data of the second node of the second latch circuit to verify to determine whether or not a program is passed or failed during a read operation.

16. The non-volatile memory device as set forth in claim 13, wherein the page buffer further includes:
   a precharging unit configured to precharge the sensing line in reading the data programmed in the memory cells; and
   a bitline selection and bias unit configured to select one of the bitlines and couple the selected bitline to the sensing line.

17. A method a non-volatile memory device comprising an array of memory cells disposed at intersections of word lines and bit lines, the device having a page buffer coupled to a sensing line, the page buffer having first and second latch units, the method comprising:
   activating the first latch unit of the page buffer during a copy-back program operation, the second latch unit of the page buffer being not be activated during the copy-back program operation; and
   activating the second latch unit during program, read, and verification operations, the first latch unit being not activated during the program, read, and verification operations,
   wherein the copy-back program operation comprises:
      reading data stored in a first memory cell from the memory cell array by selecting a bitline associated with the first memory cell, the first memory cell being a defective cell,
      inversing the read data in the first latch unit, and
      transmitting the inversed data to the selected bit line via the sensing line and reprogramming the transmitted data to a second memory cell that is different from the first memory cell.

18. The method as set forth in claim 17, wherein the reading step comprises:
   precharging the sensing line;
   thereafter, determining whether or not the sensing line is in a precharge state or discharge state.

19. The method as set forth in claim 17, wherein the program operation comprises:
   storing data received from a external source via the data line in the second latch unit;
   inversing the data stored in the second latch unit; and
   transmitting the inversed data to a selected bit line selected to program the transmitted data in a memory cell associated with the selected bit line.

20. The method as set forth in claim 17, wherein the read operation comprises:
   precharging the sensing line;
   determining whether or not the sensing line is in a precharge state or discharge state to read the data programmed in a memory cell and then store the read data in the second latch unit;
   inversing the read data stored in the second latch unit; and
   outputting the inversed data to the data line.

21. The method as set forth in claim 17, wherein the verification operation comprises:
   precharging the sensing line;
   determining whether or not the sensing line is in a precharge state or discharge state; and
   determining whether or not a program operation has failed using a voltage level of the data stored in the second latch unit.

* * * * *